US009946491B2

(12) United States Patent
Chen et al.

(10) Patent No.: US 9,946,491 B2
(45) Date of Patent: Apr. 17, 2018

(54) MEMORY ERASE METHOD, MEMORY CONTROL CIRCUIT UNIT AND MEMORY STORAGE APPARATUS, INCLUDING AN ERASE INDEX TABLE AND MOTHER-CHILD PHYSICAL ERASING UNITS

(71) Applicant: PHISON ELECTRONICS CORP., Miaoli (TW)

(72) Inventors: Chien-Yu Chen, Chiayi County (TW); Yueh-Hsuan Tsai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 9 days.

(21) Appl. No.: 15/333,196

(22) Filed: Oct. 25, 2016

(65) Prior Publication Data

US 2018/0067688 A1 Mar. 8, 2018

(30) Foreign Application Priority Data

Sep. 8, 2016 (TW) .............................. 105129176 A

(51) Int. Cl.
*G11C 16/14* (2006.01)
*G11C 16/10* (2006.01)
*G06F 3/06* (2006.01)
*G06F 11/10* (2006.01)
*G11C 29/52* (2006.01)

(52) U.S. Cl.
CPC .......... *G06F 3/0652* (2013.01); *G06F 3/0611* (2013.01); *G06F 3/0659* (2013.01); *G06F 3/0679* (2013.01); *G11C 16/10* (2013.01); *G11C 16/14* (2013.01); *G06F 3/064* (2013.01); *G06F 3/0619* (2013.01); *G06F 11/1068* (2013.01); *G11C 29/52* (2013.01)

(58) Field of Classification Search
None
See application file for complete search history.

(56) References Cited

U.S. PATENT DOCUMENTS

2006/0129749 A1 * 6/2006 Nakanishi ............. G06F 3/0613
711/103
2010/0205352 A1 * 8/2010 Chu .................... G06F 12/0246
711/103

(Continued)

*Primary Examiner* — J. H. Hur
(74) *Attorney, Agent, or Firm* — JCIPRNET

(57) ABSTRACT

A memory erase method for a rewritable non-volatile memory module is provided. The method includes: identifying a to-be-erased logical address range and a logical unit that the erased logical address range belongs to according to an erase command; determining whether the logical unit is mapped to any physical erasing unit; and if no, transmitting a message indicating that the erase command is finished in response to the erase command without performing a physical erasing operation. The method further includes: if a mother physical erasing unit for the logical unit is assigned and no physical erasing unit is assigned as a child physical erasing unit for the logical unit, creating an erase index table for the first logical unit and marking bits corresponding to the to-be-erased logical address range in the erase index table as a value indicating that a logical address is erased.

27 Claims, 11 Drawing Sheets

(56) References Cited

U.S. PATENT DOCUMENTS

| | | | | |
|---|---|---|---|---|
| 2014/0019670 A1* | 1/2014 | Huang | ................ | G06F 12/0246 |
| | | | | 711/103 |
| 2014/0331107 A1* | 11/2014 | Cheng | .................... | G06F 12/00 |
| | | | | 714/773 |
| 2014/0372668 A1* | 12/2014 | Yeh | .................... | G06F 12/0246 |
| | | | | 711/103 |
| 2015/0046632 A1* | 2/2015 | Ko | ...................... | G06F 12/0246 |
| | | | | 711/103 |
| 2015/0131386 A1* | 5/2015 | Yeh | ........................ | G11C 16/14 |
| | | | | 365/185.29 |
| 2016/0117244 A1* | 4/2016 | Yeh | .................... | G06F 12/0246 |
| | | | | 711/103 |
| 2016/0132387 A1* | 5/2016 | Yeh | ........................ | G11C 29/52 |
| | | | | 714/766 |
| 2017/0177235 A1* | 6/2017 | Nishikubo | ............ | G06F 3/0605 |

* cited by examiner

MEMORY ERASE METHOD, MEMORY CONTROL CIRCUIT UNIT AND MEMORY STORAGE APPARATUS, INCLUDING AN ERASE INDEX TABLE AND MOTHER-CHILD PHYSICAL ERASING UNITS

CROSS-REFERENCE TO RELATED APPLICATION

This application claims the priority benefit of Taiwan application serial no. 105129176, filed on Sep. 8, 2016. The entirety of the above-mentioned patent application is hereby incorporated by reference herein and made a part of this specification.

BACKGROUND

1. Technical Field

The present invention relates to a memory erase method, and more particularly, to a memory erase method for a rewritable non-volatile memory and a memory control circuit unit and a memory storage apparatus using the method.

2. Description of Related Art

The growth of digital cameras, mobile phones, and MP3 players has been rapid in recent years. Consequently, the consumers' demand for storage media has increased tremendously. A rewritable non-volatile memory module is one of the most adaptable memories for portable electronic products such as laptop computer due to its data non-volatility, low power consumption, small volume, non-mechanical structure and high read/write speed. A solid state drive is a storage apparatus adopting the rewritable non-volatile memory module as storage medium. For these reasons, rewritable non-volatile memory storage apparatuses have become an import part of the electronic industries.

Generally, the rewritable non-volatile memory storage apparatus can be used to store data only after undergoing a formatting procedure. Alternatively, users can perform a formatting operation for the rewritable non-volatile memory storage apparatus when users intend to completely delete data stored in the rewritable non-volatile memory. Specifically, taking the SD (Secure Digital) standard for example, when users use an operating interface of a host system to give a formatting command to the rewritable non-volatile memory storage apparatus connected to the host system, an erase command indicating a starting logical address (CMD 32) and an ending logical address (CMD 32) and executing an erasing operation (CMD 38) is provided to the rewritable non-volatile memory. Then, a memory controller of the rewritable non-volatile memory storage apparatus can perform the erasing operation according to the starting logical address and the ending logical address in the erase command. In other words, later when the host system intends to read data from a logical address range to which the erasing operation is already performed, the memory controller can transmit default data (e.g., data with each bit being "0") to the host system.

However, a to-be-erased logical address range of the erase command received each time may not be exactly the same. Particularly, as a capacity of the rewritable non-volatile memory storage apparatus becomes increasingly larger, if the to-be-erased logical address range of the erase command received each time is relatively small, the memory controller will need to receive the command and perform the erasing operation, repeatedly. Consequently, a time required for formatting will also increase tremendously. Therefore, it is deemed necessary to develop a mechanism capable of rapidly formatting the rewritable non-volatile memory storage apparatus.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a memory erase command, a memory control circuit unit and a memory storage apparatus, which are capable of significantly reducing a time for executing the erase command.

An exemplary embodiment provides a memory erase method for a rewritable non-volatile memory module. The rewritable non-volatile memory module has a plurality of physical erasing units and each of the physical erasing units has a plurality of physical programming units. The memory erase method includes: receiving an erase command, and identifying a to-be-erased logical address range according to the erase command. The to-be-erased logical address range belongs to a first logical unit. The method also includes: determining whether the logical unit is mapped to any physical erasing unit according to a logical address-physical address mapping table and transmitting a message indicating that the erase command is finished in response to the erase command without actually performing an erasing operation for the rewritable non-volatile memory module if the first logical unit is not mapped to any physical erasing unit. The method further includes: creating an erase index table corresponding to the first logical unit and marking at least one bit among a plurality of bits in the erase index table as a first value if a first physical erasing unit is assigned as a mother physical erasing unit corresponding to the first logical unit and no physical erasing unit is assigned as a child physical erasing unit corresponding to the first logical unit, wherein the first logical unit is divided into a plurality of logical address areas, each bit among the bits corresponds to one of the logical address areas, and the to-be-erased logical address range is the logical address area corresponding to the at least one bit marked as the first value.

An exemplary embodiment provides a memory control circuit unit configured to control a rewritable non-volatile memory module. The memory control circuit unit includes: a host interface, a memory interface and a memory management circuit. The host interface is configured to couple to a host system. The memory interface is configured to couple to the rewritable non-volatile memory module. The rewritable non-volatile memory module has a plurality of physical erasing units and each of the physical erasing units has a plurality of physical programming units. The memory management circuit is coupled to the host interface and the memory interface. The memory management circuit is configured to receive an erase command and identify a to-be-erased logical address range according to the erase command, wherein the to-be-erased logical address range belongs to a first logical unit. The memory management circuit is further configured to determine whether the first logical unit is mapped to any physical erasing unit according to a logical address-physical address mapping table. The memory management circuit is further configured to transmit a message indicating that the erase command is finished in response to the erase command without actually performing an erasing operation for the rewritable non-volatile memory module if the first logical unit is not mapped to any physical erasing unit. The memory management circuit is further configured to create an erase index table corresponding to the first logical unit and mark at least one bit among a plurality of bits in the erase index table as a first value if a first physical erasing unit is assigned as a mother physical erasing unit corresponding to the first logical unit and no physical erasing unit is assigned as a child physical erasing unit corresponding to the first logical unit, wherein the first logical unit is divided into a plurality of logical address areas, each bit among the bits corresponds to one of the logical address areas, and the to-be-erased logical address range is the logical address area corresponding to the at least one bit.

An exemplary embodiment provides a memory storage apparatus, which includes a connection interface unit configured to couple to a host system, a rewritable non-volatile memory module, and aforesaid memory control circuit unit. The rewritable non-volatile memory module has a plurality of physical erasing units and each of the physical erasing units has a plurality of physical programming units. The memory control circuit unit is coupled to the connection interface unit and the rewritable non-volatile memory module.

Based on the above, according to the memory erase method, the memory control circuit unit and the memory storage apparatus in the exemplary embodiments of the invention, a corresponding operation may be performed according to a logical address range and a mapping state of the logical unit to which the logical address rang belongs. As a result, the time for executing the erase command may be significantly reduced.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
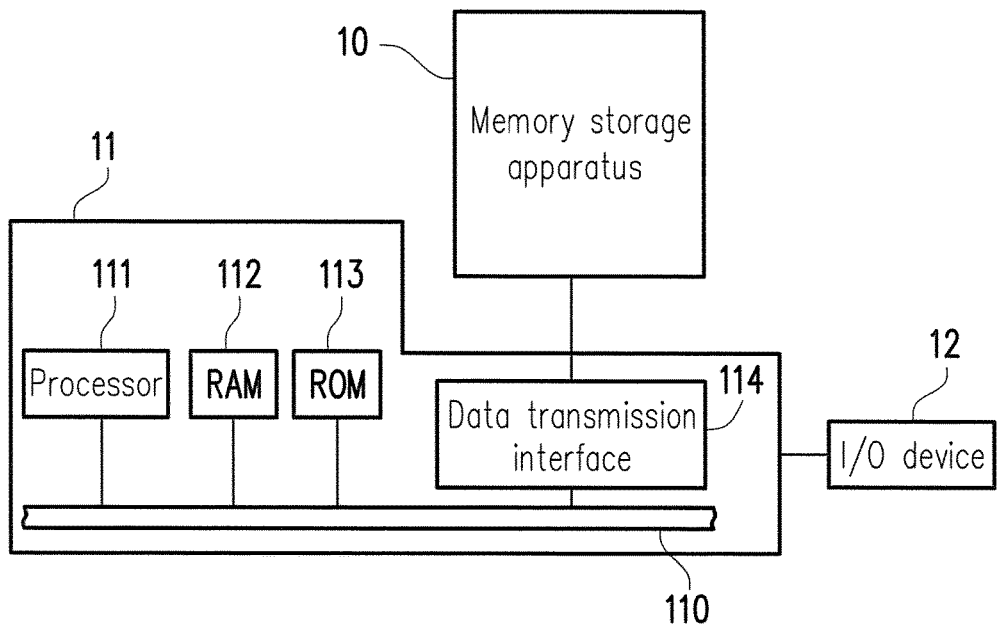
FIG. 1 is a schematic diagram illustrating a host system, a memory storage apparatus and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit unit). The memory storage apparatus is usually configured together with a host system so the host system may write data into the memory storage apparatus or read data from the memory storage apparatus.

Some technical terms may be used thereafter, please referring to a term table as follows:

| Technical term | Abbreviation |
| --- | --- |
| Logical address-physical address mapping table | L2P table |
| Physical address-Logical address mapping table | P2L table |
| Rewritable non-volatile memory module | RNVM module |
| Physical erasing unit | PEU |
| Physical programming unit | PPU |
| Logical erasing unit | LEU |
| Logical programming unit | LPU |
| Memory management circuit | MMC |
| Memory control circuit unit | MCCU |

Figure 2:
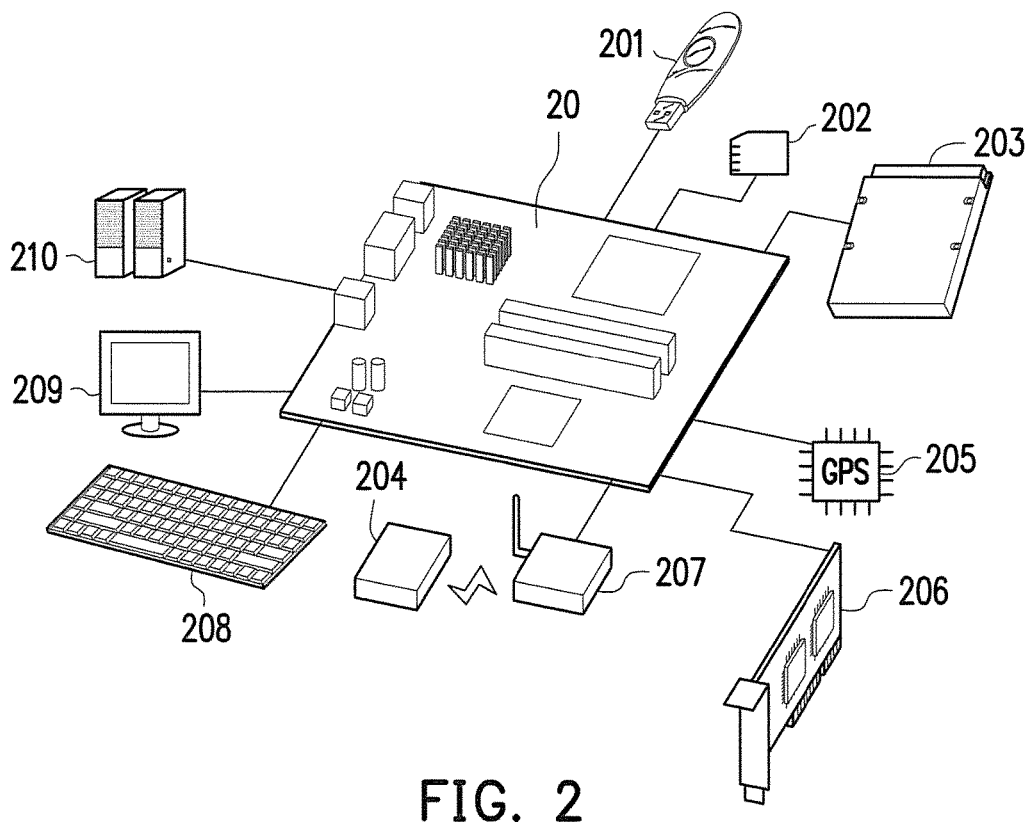
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to an exemplary embodiment, and FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 may write data into the memory storage apparatus 10 or read data from the memory storage apparatus 10 through the data transmission interface 114. Further, the host system 11 is coupled to an I/O device 12 through the system bus 110. For example, the host system 11 may transmit output signals to the I/O device 12 or receive input signals from the I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage apparatus 10 in a wired planner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage apparatus 204 through the wireless transmission device 207.

Figure 3:
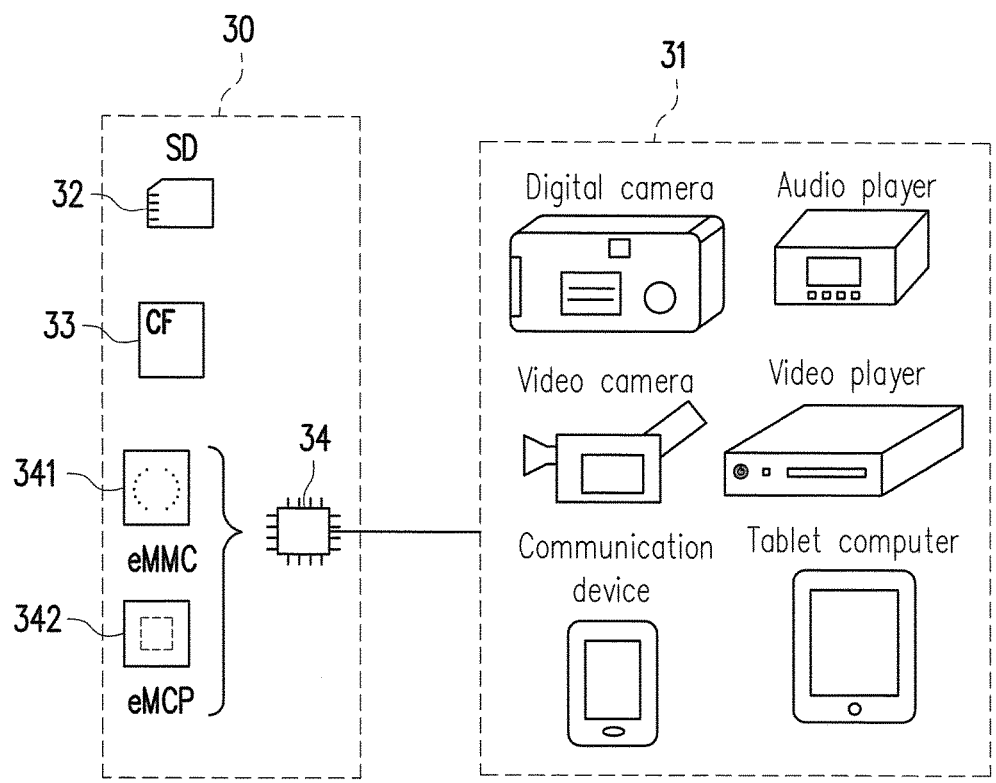
FIG. 3 is a schematic diagram illustrating a host system and a memory storage apparatus according to another exemplary embodiment.

In an exemplary embodiment, aforementioned host system may be any system capable of substantially cooperating with the memory storage apparatus for storing data. Although the host system is illustrated as a computer system in foregoing exemplary embodiment, however, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) 342.

Figure 4:
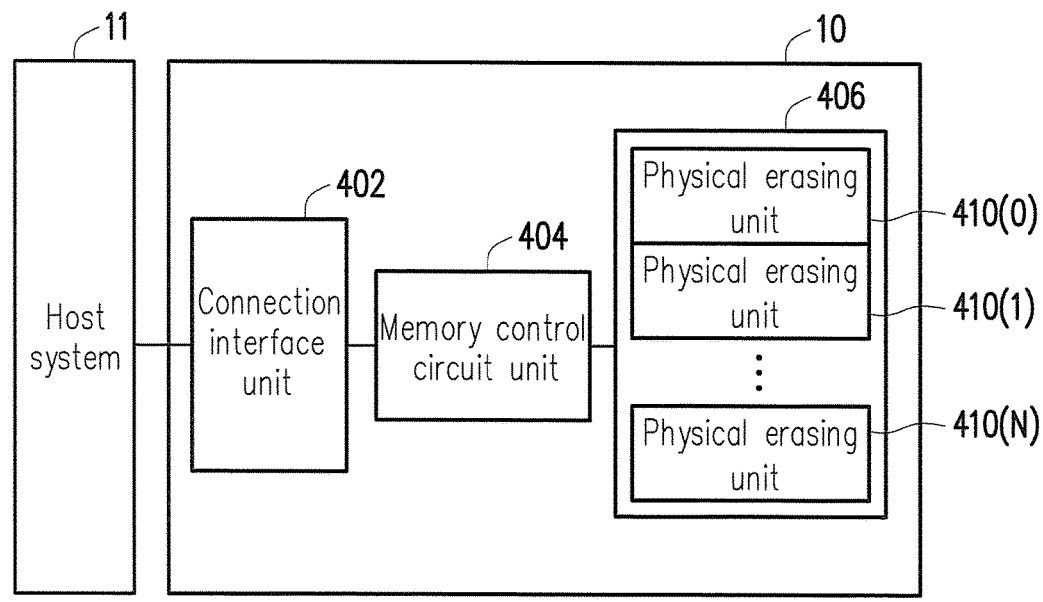
FIG. 4 is a schematic block diagram illustrating a host system and a memory storage apparatus according to an exemplary embodiment.

FIG. 4 is a schematic block diagram illustrating a host system and a memory storage apparatus according to an exemplary embodiment.

Referring to FIG. 4, the memory storage apparatus 10 includes a connection interface unit 402, a MCCU 404 and a RNVM module 406.

In the present exemplary embodiment, the connection interface unit 402 is compatible with a Secure Digital (SD) interface standard. Nevertheless, it should be understood that the invention is not limited thereto. The connection interface unit 402 may also be compatible to a SATA (Serial Advanced Technology Attachment) standard, a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a MS (Memory Stick) interface standard, a Multi-Chip Package interface standard, a Multi Media Card interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the MCCU 404 may be packaged into one chip, or the connection interface unit 402 is distributed outside of a chip containing the MCCU.

The MCCU 404 is configured to execute a plurality of logic gates or control commands which are implemented in a hardware form or in a firmware form and perform operations of writing, reading or erasing data in the rewritable non-volatile memory storage module 406 according to the commands of the host system 11.

The RNVM module 406 is coupled to the MCCU 404 and configured to store data written from the host system 11. The rewritable non-volatile memory storage module 406 includes multiple PEUs 410(0) to 410(N). For example, the PEUs 410(0) to 410(N) may belong to the same memory die or belong to different memory dies. Each PEU has a plurality of PPUs, and the PPUs of the same PEU may be written separately and erased simultaneously. Nevertheless, it should be understood that the invention is not limited thereto. Each PEU may be constituted by 64 PPUs, 256 PPUs or any number of the PPUs.

More specifically, the PEU is a minimum unit for erasing. Namely, each PEU contains the least number of memory cells to be erased together. The PPU is the minimum unit for programming. That is, the PPU is the minimum unit for writing data. Each PPU usually includes a data bit area and a redundancy bit area. The data bit area having multiple physical access addresses is used to store user data, and the redundant bit area is used to store system data (e.g., control information and error checking and correcting code). In the present exemplary embodiment, each data bit area of the PPU contains 8 physical access addresses, and the size of each physical access address is 512 byte. However, in other exemplary embodiments, the data bit area may also contain more or less physical access addresses, and the number and size of the physical access addresses are not limited by the invention. For example, in an exemplary embodiment, the PEU is a physical block, and the PPU is a physical page or a physical sector. However, the invention is not limited thereto.

In the present exemplary embodiment, the RNVM module 406 is a SLC (Single Level Cell) NAND flash memory module (i.e., a flash memory module capable of storing one data bit in one memory cell). However, the disclosure is not limited thereto. The RNVM module 406 may also be a MLC (Multi Level Cell) NAND flash memory module, (i.e., a flash memory module capable of storing two data bits in one memory cell), a TLC (Trinary Level Cell) NAND flash memory module (i.e., a flash memory module capable of storing three data bits in one memory cell), other flash memory modules or any memory module having the same features.

Figure 5:
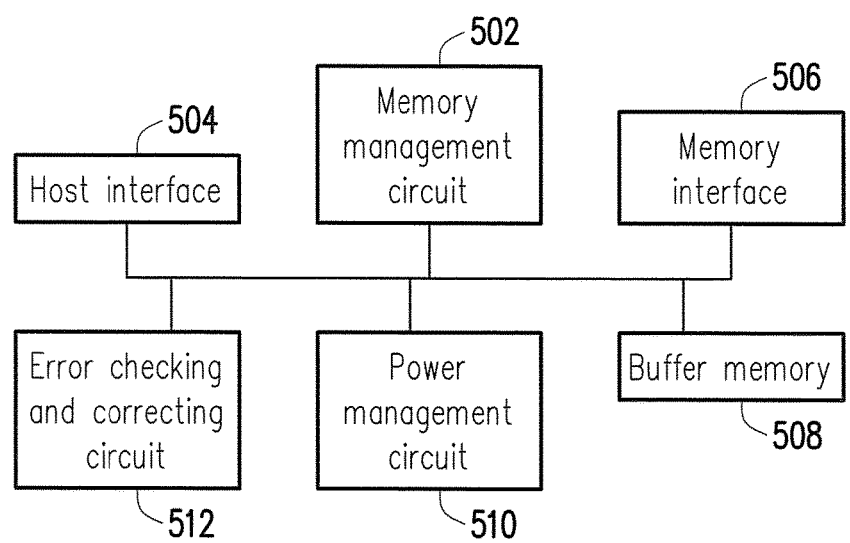
FIG. 5 is a schematic block diagram illustrating a MCCU according to an exemplary embodiment.

FIG. 5 is a schematic block diagram illustrating a MCCU according to an exemplary embodiment.

Referring to FIG. 5, the MCCU 404 includes a MMC 502, a host interface 504, a memory interface 506, a buffer memory 508, a power management circuit 510, and an error checking and correcting circuit 512.

The MMC 502 is configured to control overall operations of the MCCU 404. Specifically, the MMC 502 has a plurality of control commands and the control commands are executed to perform various operations such as writing, reading and erasing data during operation of the memory storage apparatus 10. Operations and functions performed by the MMC 502 in the following description may also be regarded as being performed by the MMC 404.

In the present exemplary embodiment, the control commands of the MMC 502 are implemented in form of firmware. For instance, the MMC 502 has a microprocessor unit (not illustrated) and a read-only memory (not illustrated), and the control commands are burnt into the read-only memory. When the memory storage apparatus 10 operates, the control commands are executed by the microprocessor to perform operations of writing, reading or erasing data.

Figure 6:
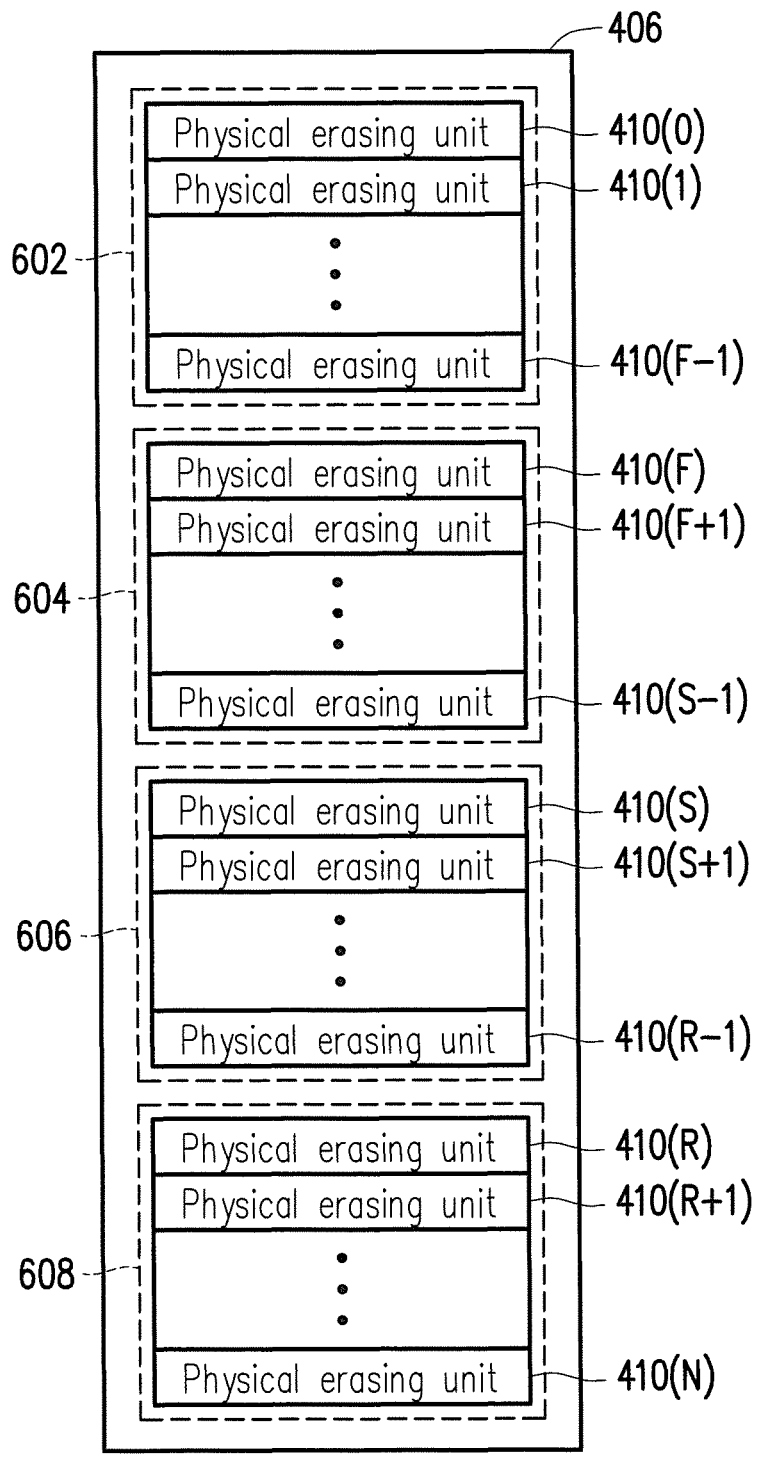
FIG. 6 and FIG. 7 are schematic diagrams illustrating a management of the PEUs according to an exemplary embodiment.
Figure 7:
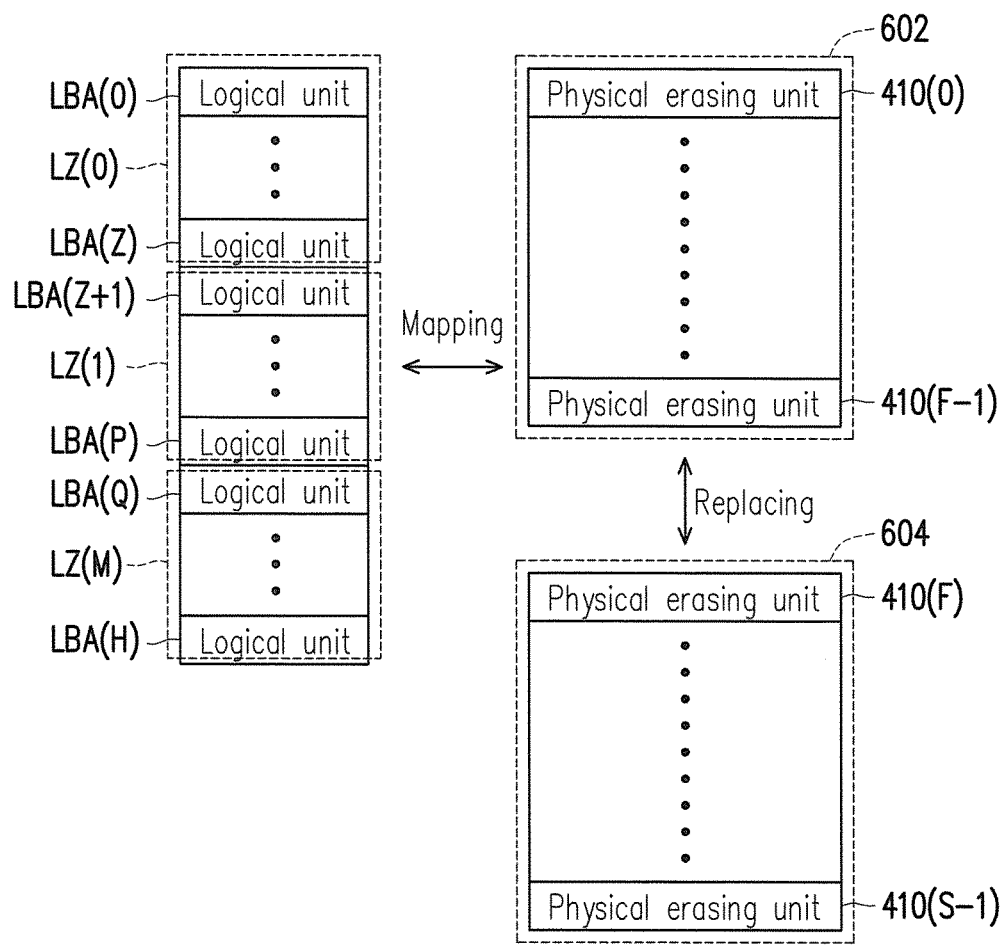

FIG. 6 and FIG. 7 are schematic diagrams illustrating a management of the PEUs according to an exemplary embodiment.

It should be understood that terms, such as "get", "retrieve", "group", "divide", "associate" and so forth, are logical concepts which describe operations in the PEUs of the RNVM module 406. That is, the PEUs of the RNVM module are logically operated, but actual positions of the physical units of the RNVM module are not changed.

Referring to FIG. 6, the MMC 502 logically groups the PEUs 410(0) to 410(N) into a data area 602, a spare area 604, a system area 606 and a replacement area 608.

The PEUs logically belonging to the data area 602 and the spare area 604 are configured to store data from the host system 11. Specifically, the PEUs of the data area 602 are regarded as the PEUs stored with data, and the PEUs of the spare area 604 are configured to replace the PEUs of the data area 602. In other words, when a write command and data to be written are received from the host system 11, the memory management unit 502 may use the PEUs retrieved from the spare area 604 for writing data, in place of the PEUs in the data area 602.

The PEUs logically belonging to the system area 606 are configured to record system data. For example, the system data includes information related to manufacturer and model of the RNVM module, a number of PEUs in the RNVM module, a number of the PPUs in each PEU, and so forth.

The PEUs logically belonging to the replacement area 608 are used in a bad PEU replacement procedure for replacing damaged PEUs. More specifically, if the replacement area 608 still includes normal PEUs when the PEUs of the data area 602 are damaged, the MMC 502 retrieves the normal PEUs from the replacement area 608 for replacing the damaged PEUs.

Particularly, the numbers of the PEUs in the data area 602, the spare area 604, the system area 606 and the replacement area 608 may be different from one another according to the different memory specifications. In addition, it should be understood that, when the memory storage apparatus 10 operates, grouping relations of the PEUs associated with the data area 602, the spare area 604, the system area 606, and the replacement area 608 may be dynamically changed. For example, when the damaged PEUs in the spare area 604 are replaced by the PEUs in the replacement area 608, the PEUs originally from the replacement area 608 are then associated with the spare area 604.

Referring to FIG. 7, the MMC 502 may be configured with logical units LBA(0) to LBA(H) for mapping to the PEUs in the data area 602, and each of the logical units includes a plurality of logical sub-units for mapping to the corresponding PPUs of the PEUs. Further, when the host system 11 intends to write the data into the logical addresses or update the data stored in the logical addresses, the memory management unit 502 may retrieve one PEU from the spare area 604 for writing the data, in place of the PEUs of the data area 602. In the present exemplary embodiment, the logical sub-units may be logical pages or logical sectors.

In order to identify which of the PEUs is the data of each logical unit being stored to, the MMC 502 may record a mapping between the logical unit and the PEU in the present exemplary embodiment. Further, when the host system 11 intends to access the data in the logical sub-unit, the MMC 502 may confirm the logical unit to which the logical sub-unit belongs and access the data in the PEU mapped to the logical unit. For instance, in the present exemplary embodiment, the MMC 502 may store L2P tables into the RNVM module 406 for recording each of the PEUs mapped by the logical units. Later, the L2P tables may be loaded into the buffer memory 508 for maintenance when the MMC 502 intends to the access the data.

It should be noted that, the mapping table cannot record the mapping relation for all of the logical addresses because a capacity of the buffer memory 508 is limited. Therefore, in the present exemplary embodiment, the memory management unit 502 may group the logical units LBA(0) to LBA(H) into a plurality of logical zones LZ(0) to LZ(M) and configure one L2P table for each of the logical zones. In particular, when the memory management unit 502 intends to update the mapping relation for one specific logical unit, the L2P table corresponding to the logical zone to which the logical unit belongs may be loaded into the buffer memory 508 for updating.

FIG. 8 to FIG. 13 illustrates an example for writing data into the RNVM module and the corresponding L2P tables according to an exemplary embodiment.

Figure 8:
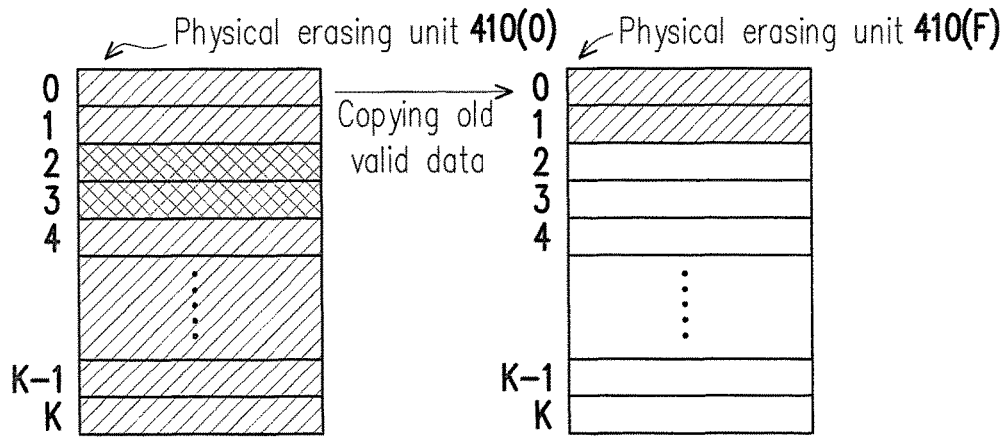
FIG. 8 to FIG. 13 illustrates an example for writing data into the RNVM module and the corresponding L2P tables according to an exemplary embodiment.
Figure 9:
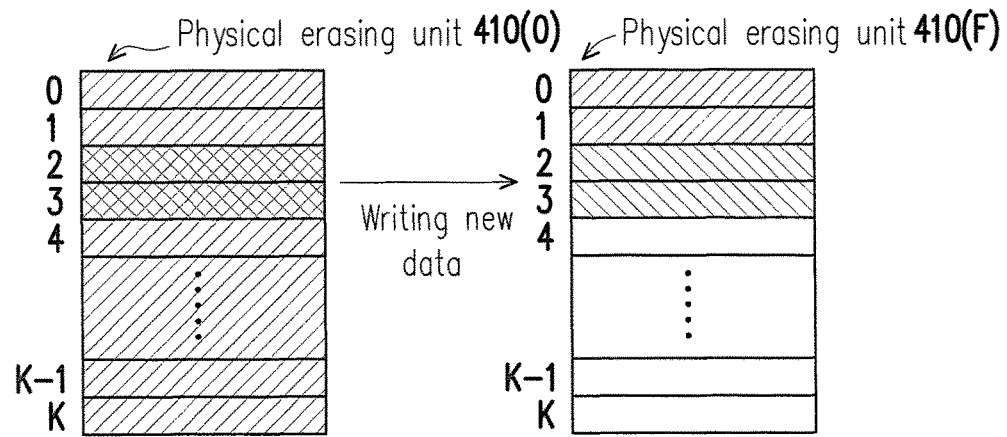

Referring to FIG. 8 to FIG. 13, in this example, the RNVM module 406 of the memory storage apparatus 10 is managed based on the PEUs (also known as a block based management). Specifically, with the mapping state (as shown by a L2P table 1101 in FIG. 11) in which the logical address LBA(0) is mapped to the PEU 410(0), when the MMC 502 intends to write data into the logical address belonging to the logical unit LBA(0) after receiving a write command from the host system 11, the MMC 502 may identify that the logical unit LBA(0) is currently mapped to the PEU 410(0) according to the L2P table and retrieve the PEU 410(F) from the spare area 604 as a replacement PEU to replace the PEU 410(0). However, while the MMC 502 is writing new data into the PEU 410(F), the MMC 502 does not immediately move all valid data in the PEU 410(0) to the PEU 410(F) and erase the PEU 410(0). Specifically, the MMC 502 may copy the valid data in the PEU 410(0) in those before the PPUs to be written (i.e., data in a $0^{th}$ PPU and a $1^{st}$ PPU of the PEU 410(0)) to a $0^{th}$ PPU and a $1^{st}$ PPU of the PEU 410(F) (as shown in FIG. 8), and write the new data into a $2^{nd}$ PPU and a $3^{rd}$ PPU of the PEU 410(F) (as shown in FIG. 9). After doing so, the writing operation is completed by the MMC 502. Since the valid data in the PEU 410(0) may become invalid in the next operation (e.g., the write command), it is unnecessary to move the valid data immediately from the PEU 410(0) to the PEU 410(F). Further, the data need to be written into the PPU of the PEU in sequence. As such, the MMC 502 only moves the valid data in those before the PPU to be written.

In the present exemplary embodiment, an operation of temporarily maintaining this kind of mother-child transient state relationship (i.e., the PEU 410(0) and the PEU 410(F)) is also known as opening the mother-child PEUs. Also, the original PEU is known as a mother PEU and the replacement PEU is known as a child PEU. For example, the MMC 502 may record a mapping entry of the child PEU into the L2P table (as shown by the L2P table 1101 in FIG. 12).

Further, in response to the mother PEU corresponding to one logical unit being opened namely, data of one logical unit is stored in one PEU (i.e., the mother PEU) and another PEU is assigned as the child PEU to write the update data for said logical unit—the MMC 502 may also use another PEU (e.g., the PEU 410(F+1)) to store small data (i.e., data with a data volume less than a capacity of one PPU) belonging to the logical unit LBA(0). Specifically, as described above, the PPU is the minimum unit for writing data. Therefore, the MMC 502 may first temporarily program the small data into one PEU (also known as a temporary PEU) and then program other data with the small data, which are capable of fulfilling the entire PPU, into the child PEU. For example, information for assigning the temporary PEU may also be recorded into the L2P table, or into a temporary mapping table that is additionally configured.

Figure 10:
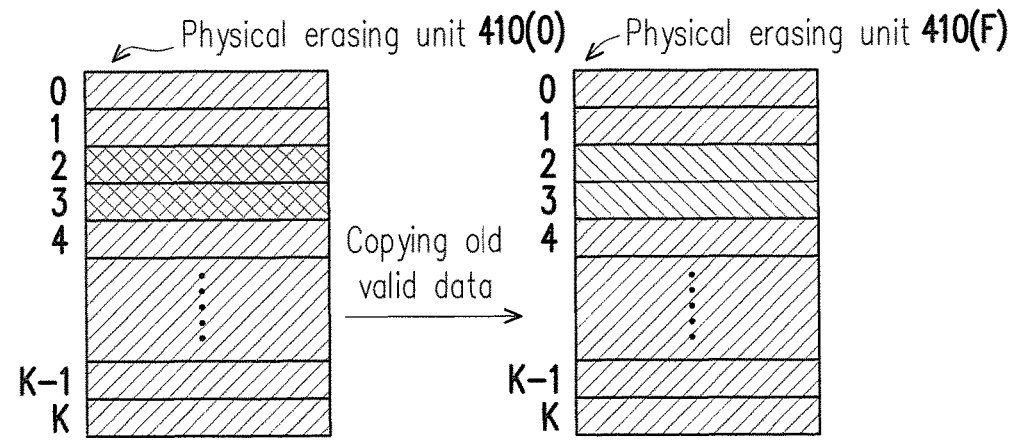
Figure 11:
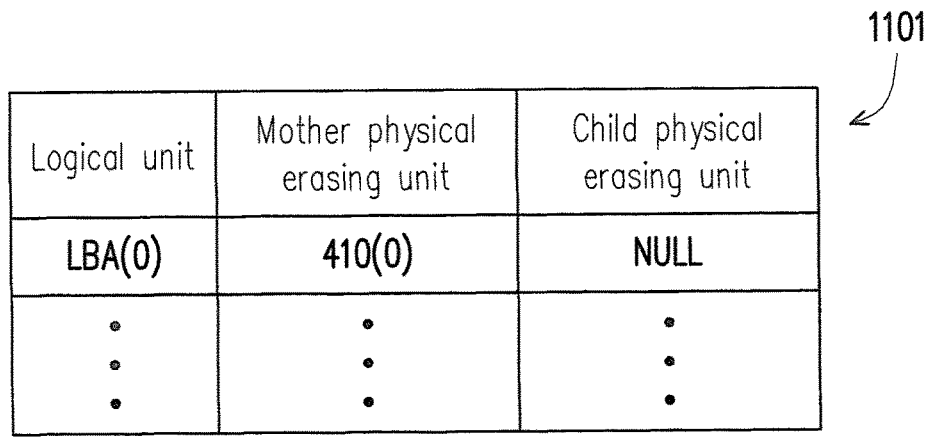
Figure 12:
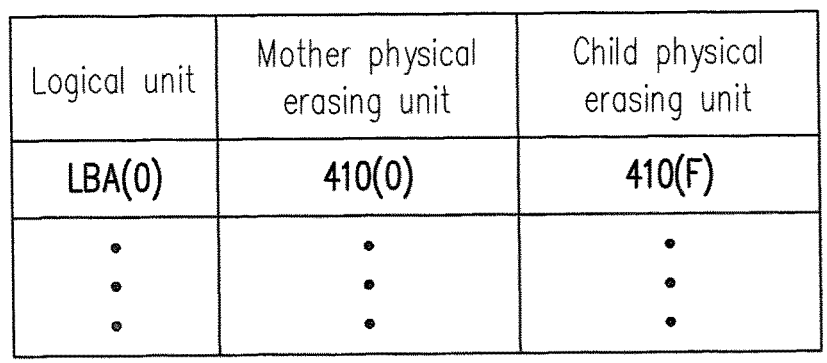
Figure 13:
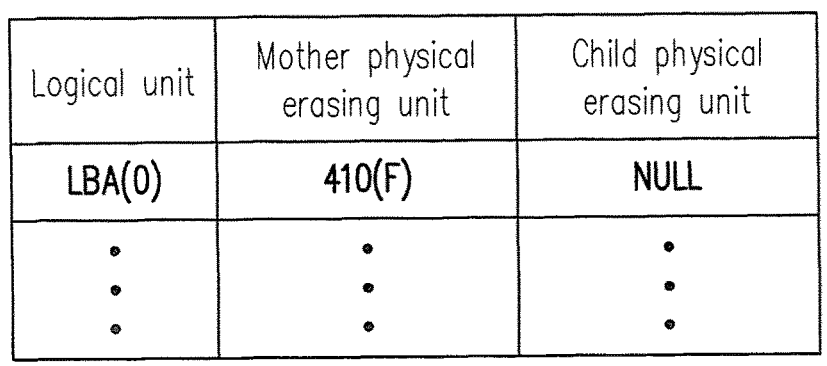

Later, the MMC 502 may merge the data of the PEU 410(0) and the PEU 410(F) into one PEU only when contents of the PEU 410(0) and the PEU 410(F) need to be merged, so as to improve a usage efficiency of the PEUs. Here, an operation of merging the mother-child PEUs is also known as a data merging operation or closing the mother-child PEUs. For example, as shown in FIG. 10, while closing the mother-child PEUs, the MMC 502 can copy the remaining valid data in the PEU 410(0) (i.e., data in a $4^{th}$ PPU to a $K^{th}$ PPU of the PEU 410(0)) to a $4^{th}$ PPU to a $K^{th}$ PPU of the replacement PEU 410(F), erase the PEU 410(0) and then associate the same with the spare area 604. Meanwhile, the PEU 410(F) is associated with the data area 502. In other words, the MMC 502 can re-map the logical unit LBA(0) to the PEU 410(F) in the L2P table (as shown by the L2P table 1101 in FIG. 13). It is noted that, if any PEU is assigned as the temporary PEU of the logical unit, because the valid data in said temporary PEU is already programmed into the corresponding PPUs during the data merging operation, the MMC 502 may re-associate the temporary PEU with the spare area 604.

In the present exemplary embodiment, the MMC 502 can create a spare area PEU table (not illustrated) to record the PEUs currently associated with the spare area. It is worth mentioning that, a number of the PEUs in the spare area 604 is limited. Accordingly, when the memory storage apparatus 10 operates, a number of groups of mother-child PEUs being opened is also limited. Therefore, when the write command is received by the memory storage apparatus 10 from the host system 11, if the number of groups of the mother-child PEUs being open reaches its upper limit, the MMC 502 needs to close at least one group of the currently opened mother-child units (i.e., closing the mother-child PEUs) in order to execute the write command.

In another exemplary embodiment, the control commands of the MMC 502 may also be stored, in form of program codes, into a specific area (e.g., a system area in the memory module exclusively used for storing the system data) of the RNVM module 406. In addition, the MMC 502 has a microprocessor unit (not illustrated), a ROM (not illustrated) and a RAM (not illustrated). Particularly, the ROM has an activate code, which is executed by the microprocessor unit to load the control commands stored in the RNVM module 406 to the RAM of the MMC 502 when the MCCU 404 is enabled. Then, the control commands are executed by the microprocessor unit to perform operations, such as writing, reading or erasing data.

Further, in another exemplary embodiment of the invention, the control commands of the MMC 502 may also be implemented in a form of hardware. For example, the MMC 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The MMC is configured to manage the PEUs of the RNVM module 406; the memory writing circuit is configured to issue a write command to the RNVM module 406 in order to write data into the RNVM module 406; the memory reading circuit is configured to issue a read command to the RNVM module 406 in order to read data from the RNVM module 406; the memory erasing circuit is configured to issue an erase command to the RNVM module 406 in order to erase data from the RNVM module 406; the data processing circuit is configured to process both the data to be written into the RNVM module 406 and the data to be read from the RNVM module 406.

Referring back to FIG. 5, the host interface 504 is coupled to the MMC 502 and configured to couple to the connection interface unit 402, so as to receive and identify commands and data sent from the host system 11. In other words, the commands and data transmitted by the host system 11 are transmitted to the MMC 502 through the host interface 504. In the present exemplary embodiment, the host interface 504 is compatible with the SD standard. Nevertheless, it should be understood that the invention is not limited thereto. The host interface 504 may also be compatible with the SATA standard, the PATA standard, the IEEE 1394 standard, the PCI Express standard, the USB standard, the UHS-I interface standard, the UHS-II interface standard, the MS standard, the Multi Media Card standard, the CF standard, the IDE standard, or other suitable standards for data transmission.

The memory interface 506 is coupled to the MMC 502 and configured to access the RNVM module 406. In other words, data to be written into the RNVM module 406 is converted into a format acceptable by the RNVM module 406 through the memory interface 506.

The buffer memory 508 is coupled to the MMC 502 and configured to temporarily store data and commands from the host system 11 or data from the RNVM module 406.

The power management unit 510 is coupled to the MMC 502 and configured to control power of the memory storage apparatus 10.

The error checking and correcting circuit 512 is coupled to the MMC 502 and configured to perform an error checking and correcting procedure to ensure the data integrity. For example, when a write command is received by the MMC 502 from the host system 11, the error checking and correcting circuit 512 can generate an ECC code (error checking and correcting code) for data corresponding to the write command so the MMC 502 can write the data and the ECC code corresponding to the write command to the RNVM module 406. Subsequently, the MMC 502 can read the error checking and correcting code corresponding to the data while reading the data from the RNVM module 406, and the error checking and correcting circuit 512 can then perform the error checking and correcting procedure for the read data according to the error checking and correcting code.

In the present exemplary embodiment, when an erase command is received by the memory storage apparatus 10, the MMC 502 can identify a to-be-erased logical address range according to a starting logical address and an ending logical address indicated by the erase command and identify a corresponding logical unit (e.g., the logical unit LBA(0)) according to the to-be-erased logical address range. Particularly, the MMC 502 can determine whether the identified logical unit is mapped to the PEU. For example, according to the L2P table, the MMC 502 can determine whether any PEU is assigned as the mother PEU, the child PEU or the temporary PEU for the logical unit. If no PEU is assigned as the mother PEU, the child PEU or the temporary PEU corresponding to the logical unit, the MMC 502 can transmit a message indicating that the erase command is finished in response to the erase command. In other words, when the logical unit that the to-be-erased logical address range belongs to is not stored with data, the MMC 502 does not actually perform the programming or erasing operations for the RNVM module 406 (namely, the MMC 502 does not perform a physical erase operation for the RNVM module 406) but directly replies the message indicating that the erase command is finished, so as to inform that the erasing operation is completed. In this example, because the MMC 502 does not perform the programming or erasing operations for the RNVM module 406, the time for executing the erase command may be significantly reduced.

In the present exemplary embodiment, if one of the PEUs of the RNVM module 406 is assigned as the mother PEU for the logical unit including the to-be-erased logical address range, the MMC 502 may determine whether one PEU is assigned as the child PEU for the logical unit including the to-be-erased logical address range. If no PEU is assigned as the child PEU for the logical unit including the to-be-erased logical address range, the MMC 502 may create an erase index table corresponding to the logical unit and mark an index (or known as a bit) corresponding to the to-be-erased logical address range as a value (hereinafter, referred to as a first value) indicating that the logical address is erased. In addition, the MMC 502 may determine whether one PEU is assigned as the temporary PEU for the logical unit including the to-be-erased logical address range and is temporarily stored with the data belonging to the to-be-erased logical address range. When the data belonging to the to-be-erased logical address range is temporarily stored in the temporary PEU corresponding to the first logical unit, the MMC 502 may delete the corresponding mapping entry. In another exemplary embodiment, the MMC 502 can further update the temporary mapping table corresponding to the temporary PEU. Accordingly, later when the host system 11 reads the data from said logical unit, if the corresponding bit in the erase index table is marked as the first value, the MMC 502 may transmit default data to the host system 11. Otherwise, if the corresponding bit in the erase index table is marked as another value (e.g., a second value), the MMC 502 can transmit the stored data to the host system 11. Because the MMC 502 utilizes the erase index table to rapidly record the erased addresses without actually erasing data from the RNVM module 406 or programming the default data into the RNVM module 406, the time for executing the erase command may be significantly reduced.

Figure 14:
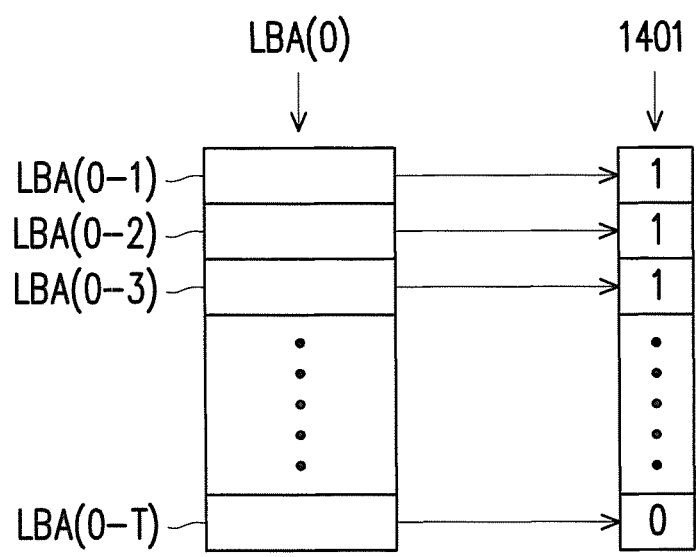
FIG. 14 is a schematic diagram illustrating an erase index table according to an exemplary embodiment.

FIG. 14 is a schematic diagram illustrating an erase index table according to an exemplary embodiment.

Referring to FIG. 14, when an erase index table 1401 corresponding to the logical unit is created, the MMC 502 can divide the logical unit (e.g., the logical unit LBA(0)) into a plurality of logical address areas LBA(0-1) to LBA(0-T) and configure T bits in the erase index table 1401 for corresponding to the logical address areas LBA(0-1) to LBA(0-T) of the logical unit, respectively. When the to-be-erased logical address range covers the logical address areas LBA(0-1) to LBA(0-3), the MMC 502 can mark the bits corresponding to the logical address areas LBA(0-1) to LBA(0-3) as the first value (e.g., "1"). For example, the size of each of the logical address areas is fixed to one megabyte. Nonetheless, it should be understood that, in another exemplary embodiment, the MMC 502 may dynamically set the size of each of logical address areas according to the size of the logical unit and configure the bit in the erase index table according to the number of the logical address areas when creating the erase index table.

When one of the PEUs of the RNVM module 406 is assigned as the mother PEU for the logical unit including the to-be-erased logical address range and another one PEU is assigned as the child PEU for the logical unit including the to-be-erased logical address range, the MMC 502 may decide whether to program to program the default data into the child PEU corresponding to the logical unit, or only update the mapping entry of the L2P table.

Specifically, the MMC 502 may determine whether a starting logical address of the to-be-erased logical address range follows an ending logical address of a previous erase command and whether an ending logical address of the to-be-erased logical address range is an ending logical address of the logical unit that the to-be-erased logical address range belongs to. If the starting logical address of the to-be-erased logical address range follows the ending logical address indicated by the previous erase command and the ending logical address of the to-be-erased logical address range is the ending logical address of the logical unit that the to-be-erased logical address range belongs to, the MMC 502 may directly update the mapping entry of the logical unit in the L2P table (i.e., by deleting the mapping entry of the logical unit). If the starting logical address of the to-be-erased logical address range does not follow the ending logical address indicated by the previous erase command or the ending logical address of the to-be-erased logical address range is not the ending logical address of the logical unit that the to-be-erased logical address range belongs to, the MMC 502 may program the default data into the corresponding PPUs, as shown by the writing operation in FIG. 8 to FIG. 10.

For example, in the situation shown by FIG. 9, if the to-be-erased logical address range instructed by the host system 11 belongs to the logical unit LBA(0) and is mapped to $0^{th}$ to $(K/3)^{th}$ PPUs of the PEU 410(0), since the ending logical address of the to-be-erased logical address range is not the ending logical address of the logical unit that the to-be-erased logical address range belongs to and $0^{th}$ to $3^{rd}$ PPUs of the child PEU corresponding to the mother PEU 410(0) are stored with data, the MMC 502 can retrieve another PEU (e.g., the PEU 410(S-1)) as the child PEU corresponding to the mother PEU 410(0), program the default data into $0^{th}$ to $(K/3)^{th}$ PPUs of the child PEU 410(S-1) and associate the PEU 410(F) back with the spare area 604. Later, if the to-be-erased logical address range instructed again by the host system 11 belongs to the logical unit LBA(0) and is mapped to $(K/3+1)^{th}$ to $(2\times K/3)^{th}$ PPUs of the PEU 410(0), since the ending logical address of the to-be-erased logical address range is not the ending logical address of the logical unit that the to-be-erased logical address range belongs to, the MMC 502 programs the default data into $(K/3+1)^{th}$ to $(2 \times K/3)^{th}$ PPUs of the child PEU 410(S-1). Moreover, if the to-be-erased logical address range instructed again by the host system 11 belongs to the logical unit LBA(0) and is mapped to $(2 \times K/3)^{th}$ to $K^{th}$ PPUs of the PEU 410(0), since the starting logical address of the to-be-erased logical address range follows the ending logical address indicated by the previous erase command and the ending logical address of the to-be-erased logical address range is the ending logical address of the logical unit that the to-be-erased logical address range belongs to, the MMC 502 may delete the mapping entry of the logical unit LBA(0) in the L2P table. That is to say, the logical unit LBA(0) is no longer mapped to the PEU. In this example, in terms of erasing one logical unit, the MMC 502 is able to save the time for programming the default data the last time. Therefore, the time for executing the erase command may be effectively reduced.

Figure 15A:
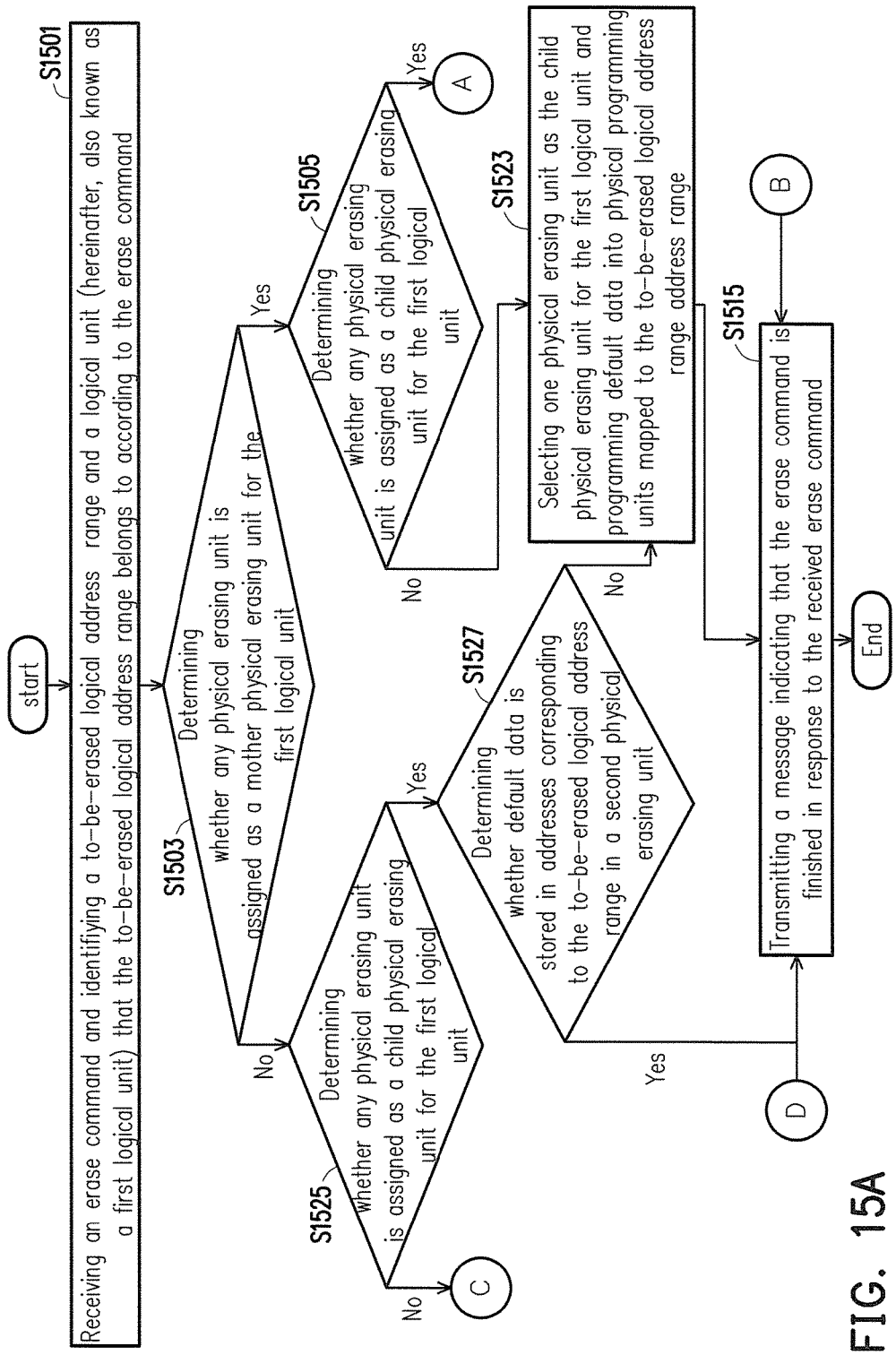
FIG. 15A, FIG. 15B and FIG. 15C illustrate a flowchart of a memory erase method according to an exemplary embodiment.
Figure 15B:
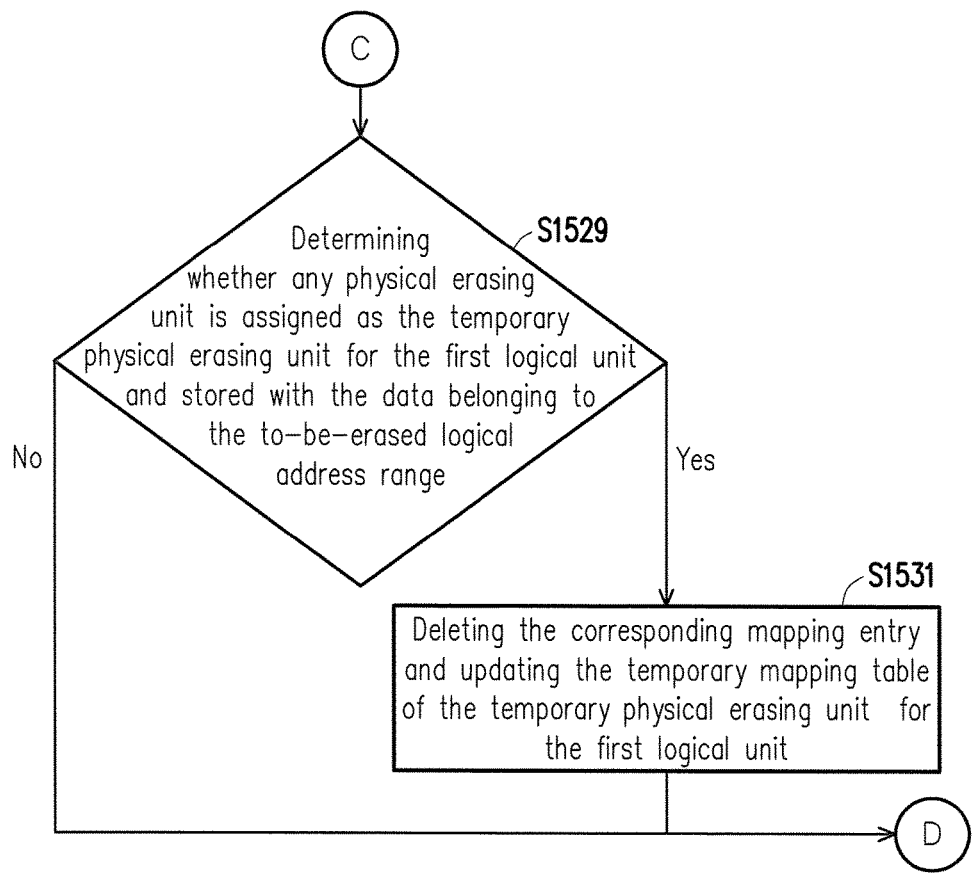
Figure 15C:
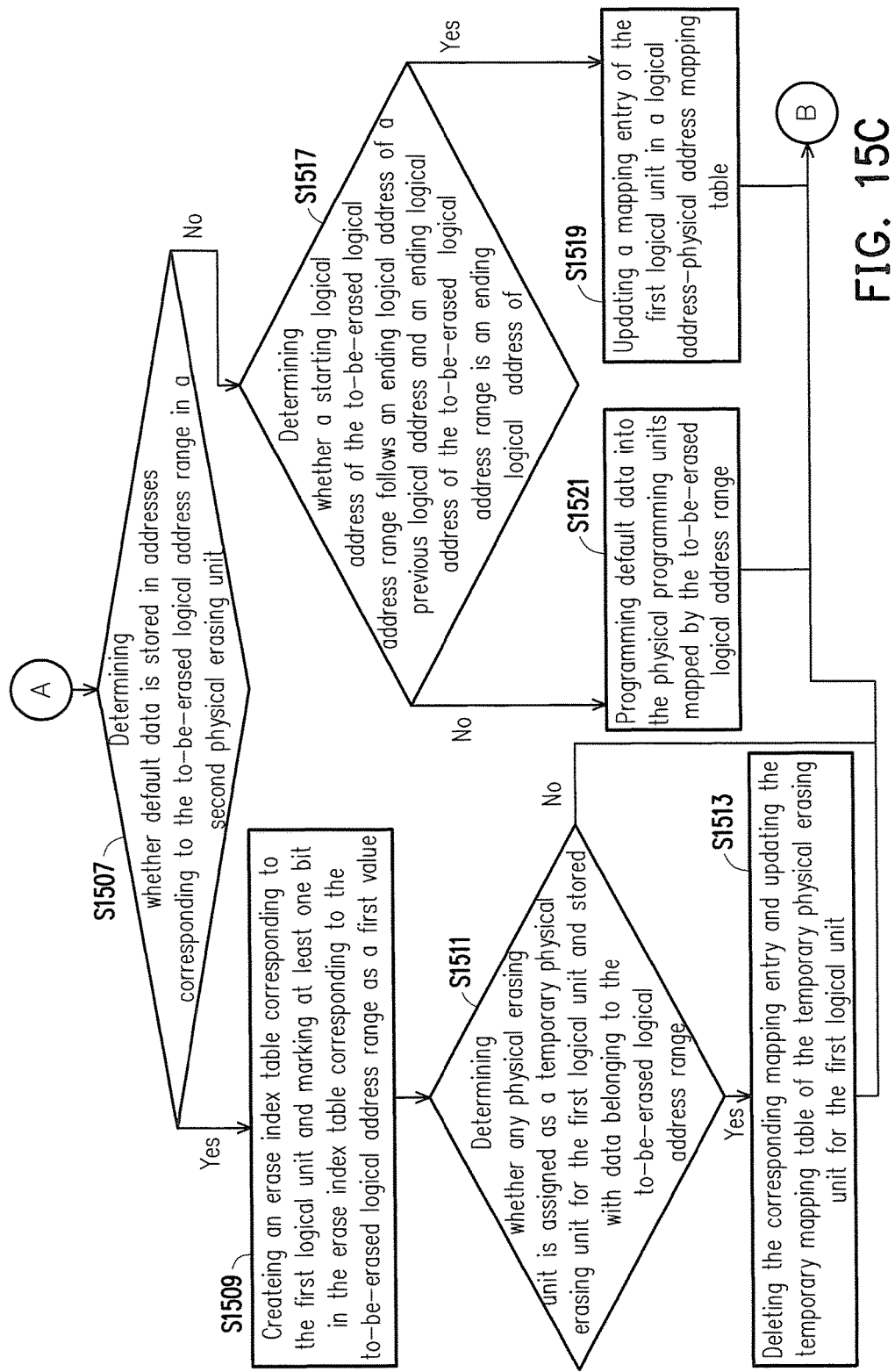

FIG. 15A, FIG. 15B and FIG. 15C illustrate a flowchart of a memory erase method according to an exemplary embodiment.

Referring to FIG. 15A-15C, in step S1501, the MMC 502 receives an erase command and identifies a to-be-erased logical address range and a logical unit (hereinafter, also known as a first logical unit) that the to-be-erased logical address range belongs to according to the erase command.

In step S1503, the MMC 502 determines whether any PEU is assigned as a mother PEU for the first logical unit. For example, the MMC 502 may obtain mapping information of the first logical unit according to a mapping entry in a L2P table.

If one of the PEUs (hereinafter, also known as a first PEU) is assigned as the mother PEU for the first logical unit, the MMC 502 determines whether any PEU is assigned as a child PEU for the first logical unit in step S1505. If one of the PEUs (hereinafter, also known as a second PEU) is assigned as the child PEU for the first logical unit, the MMC 502 determines whether default data (e.g., data with each bit being "0") is stored in addresses corresponding to the to-be-erased logical address range in the second PEU in step S1507.

If the default data is stored in the addresses corresponding to the to-be-erased logical address range in the second PEU, the MMC 502 creates an erase index table corresponding to the first logical unit and marks at least one bit in the erase index table corresponding to the to-be-erased logical address range as a first value in step S1509. The method for creating the erase index table and marking the bits have been described above in details, which are not repeated hereinafter.

Then, in step S1511, the MMC 502 determines whether any PEU is assigned as a temporary PEU for the first logical unit and stored with data belonging to the to-be-erased logical address range.

If one of the PEUs is assigned as the temporary PEU for the first logical unit and the temporary PEU for the first logical unit is stored with the data belonging to the to-be-erased logical address range, the MMC 502 deletes the corresponding mapping entry and updates the temporary mapping table of the temporary PEU for the first logical unit in step S1513.

Subsequently, in step S1515, the MMC 502 transmits a message indicating that the erase command is finished in response to the received erase command.

Step S1515 is executed if it is determined in step S1511 that no PEU is assigned as the temporary PEU for the first logical unit or the temporary PEU corresponding to the first logical unit is not stored with the data belonging to the to-be-erased logical address range.

If it is determined in step S1507 that the default data is not stored in the addresses corresponding to the to-be-erased logical address range in the second PEU, the MMC 502 determines whether a starting logical address of the to-be-erased logical address range follows an ending logical address of a previous logical address and an ending logical address of the to-be-erased logical address range is an ending logical address of the first logical unit in step S1517.

If the staring logical address of the to-be-erased logical address range follows the ending logical address of the previous erase command and the ending logical address is the ending logical address of the first logical unit, the MMC 502 updates the mapping entry of the first logical unit in a L2P table (i.e., by deleting a mapping relation between the first logical unit and the PEU) in step S1519. Then, step S1515 is executed.

If the starting logical address of the to-be-erased logical address range does not follow the ending logical address of the previous erase command or the ending logical address of the to-be-erased logical address range is not the ending logical address of the first logical unit, the MMC 502 programs default data into the PPUs mapped by the to-be-erased logical address range in step S1521. Then, step S1515 is executed.

If it is determined in step S1505 that no PEU is assigned as the child PEU for the first logical unit, the MMC 502 selects one PEU as the child PEU for the first logical unit and programs the default data into the PPUs mapped to the to-be-erased logical address range in step S1523. Then, step S1515 is executed.

If it is determined in step S1503 that no PEU is assigned as the mother PEU for the first logical unit, the MMC 502 determines whether any PEU is assigned as the child PEU for the first logical unit in step S1525. If one of the PEUs (hereinafter, also known as a second PEU) is assigned as the child PEU for the first logical unit, the MMC 502 determines whether default data (e.g., data with each bit being "0") is stored in addresses corresponding to the to-be-erased logical address range in the second PEU in step S1527.

Step S1515 is executed if the default data is stored in the addresses corresponding to the to-be-erased logical address range in the second PEU; and Step S1523 is executed if the default data is not stored in the addresses corresponding to the to-be-erased logical address range in the second PEU.

If it is determined in step S1525 that no PEU is assigned as the child PEU for the first logical unit, the MMC 502 determines whether any PEU is assigned as the temporary PEU for the first logical unit and stored with the data belonging to the to-be-erased logical address range in step S1529. If one of the PEUs is assigned as the temporary PEU for the first logical unit and the temporary PEU for the first logical unit is stored with the data belonging to the to-be-erased logical address range, the MMC 502 deletes the corresponding mapping entry and updates the temporary mapping table of the temporary PEU for the first logical unit in step S1531; and Step S1515 is executed if no PEU is assigned as the temporary PEU for the first logical unit or the temporary PEU corresponding to the first logical unit is not stored with the data belonging to the to-be-erased logical address range. In other words, after determining that no PEU is stored with the data belonging to the first logical unit, the MMC 502 does not perform the physical erasing operation for the RNVM module 406 but directly replies the message indicating that the erase command is finished.

In summary, according to the memory erase method, the MCCU and the memory storage apparatus in the exemplary embodiments of the invention, after the erase command is received, different operations may be performed according to the logical address range and the mapping state of the logical unit that the logical address range belongs to. As a result, the values read from the to-be-erased logical address range may be changed to the default data more rapidly and the time required for executing the erase command may be significantly reduced. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory erase method for a rewritable non-volatile memory module,
    the rewritable non-volatile memory module having a plurality of physical erasing units, each physical erasing unit among the physical erasing units having a plurality of physical programming units, the memory erase method comprising:
    receiving an erase command;
    identifying a to-be-erased logical address range according to the erase command, wherein the to-be-erased logical address range belongs to a first logical unit;
    transmitting a message indicating that the erase command is finished in response to the erase command without actually performing an erasing operation on the rewritable non-volatile memory module if the first logical unit is not mapped to any physical erasing unit among the physical erasing units;
    creating an erase index table corresponding to the first logical unit and marking at least one bit among a plurality of bits in the erase index table as a first value if a first physical erasing unit among the physical erasing units is assigned as a mother physical erasing unit corresponding to the first logical unit and no physical erasing unit among the physical erasing units is assigned as a child physical erasing unit corresponding to the first logical unit,
    wherein the first logical unit is divided into a plurality of logical address areas, each bit among the bits corresponds to one of the logical address areas, and the to-be-erased logical address range is the logical address area corresponding to the at least one bit.

2. The memory erase method according to claim 1, further comprising:
    deleting a mapping entry corresponding to the to-be-erased logical address range if data belonging to the to-be-erased logical address range is stored in a temporary physical erasing unit corresponding to the first logical unit after creating the erase index table corresponding to the first logical unit and marking the at least one bit among the bits in the erase index table as the first value.

3. The memory erase method according to claim 2, further comprising: determining whether the data belonging to the to-be-erased logical address range is stored in the temporary physical erasing unit corresponding to the first logical unit after creating the erase index table corresponding to the first logical unit and marking the at least one bit among the bits in the erase index table as the first value.

4. The memory erase method according to claim 2, further comprising: updating a temporary mapping table of the temporary physical erasing unit corresponding to the first logical unit after deleting the mapping entry corresponding to the to-be-erased logical address range.

5. The memory erase method according to claim 1, further comprises:
    determining whether any physical erasing unit among the physical erasing units is assigned as the mother physical erasing unit corresponding to the first logical unit;
    determining whether any physical erasing unit among the physical erasing units is assigned as the child physical erasing unit corresponding to the first logical unit;
    determining whether any physical erasing unit among the physical erasing units is assigned as the temporary physical erasing unit corresponding to the first logical unit; and
    identifying the first logical unit as not mapped to any physical erasing unit among the physical erasing units if no physical erasing unit among the physical erasing units is assigned as the mother physical erasing unit, the child physical erasing unit and the temporary physical erasing unit corresponding to the first logical unit.

6. The memory erase method according to claim 1, wherein the step of creating the erase index table corresponding to the first logical unit comprises:
    dynamically setting the size of each of the logical address areas according to the size of the logical unit, calculating the number of the logical addresses according to the size of each of the logical address areas, and configuring the bits of the erase index table according to the number of the logical address areas.

7. The memory erase method according to claim 1, further comprising:
    determining whether a starting logical address of the to-be-erased logical address range follows an ending logical address indicated by a previous erase command if a second physical erasing unit among the physical erasing units is programmed as the child physical erasing unit corresponding to the first logical unit;
    determining whether an ending logical address of the to-be-erased logical address range is identical to an ending logical address of the first logical unit if the starting logical address of the to-be-erased logical address range follows the ending logical address indicated by the previous erase command; and
    deleting a mapping entry of the first logical unit in a logical address-physical address mapping table if the ending logical address of the to-be-erased logical address range is identical to the ending logical address of the first logical unit.

8. The memory erase method according to claim 7, further comprising:
    programming default data into at least one physical programming unit of the second physical erasing unit if the starting logical address of the to-be-erased logical address range does not follow the ending logical address indicated by the previous erase command, wherein the at least one physical programming unit of the second physical erasing unit is mapped to the to-be-erased logical address range.

9. The memory erase method according to claim 7, further comprising:

programming default data into at least one physical programming unit of the second physical erasing unit if the ending logical address of the to-be-erased logical address range is not identical to the ending logical address of the first logical unit, wherein the at least one physical programming unit of the second physical erasing unit is mapped to the to-be-erased logical address range.

10. A memory control circuit unit, configured to control a rewritable non-volatile memory module, and the memory control circuit unit comprising:
   a host interface, configured to couple to a host system;
   a memory interface, configured to couple to the rewritable non-volatile memory module, wherein the rewritable non-volatile memory module has a plurality of physical erasing units and each physical erasing unit among the physical erasing units has a plurality of physical programming units; and
   a memory management circuit, coupled to the host interface and the memory interface,
   wherein the memory management circuit is configured to receive an erase command and identify a to-be-erased logical address range according to the erase command, wherein the to-be-erased logical address range belongs to a first logical unit;
   wherein the memory management circuit is further configured to determine whether the first logical unit is mapped to any physical erasing unit among the physical erasing units according to a logical address-physical address mapping table,
   the memory management circuit is further configured to transmit a message indicating that the erase command is finished in response to the erase command without actually performing an erasing operation on the rewritable non-volatile memory module if the first logical unit is not mapped to any physical erasing unit among the physical erasing units, and
   the memory management circuit is further configured to create an erase index table corresponding to the first logical unit and mark at least one bit among a plurality of bits in the erase index table as a first value if a first physical erasing unit among the physical erasing units is assigned as a mother physical erasing unit corresponding to the first logical unit and no physical erasing unit among the physical erasing units is assigned as a child physical erasing unit corresponding to the first logical unit, wherein the first logical unit is divided into a plurality of logical address areas, each bit among the bits corresponds to one of the logical address areas, and the to-be-erased logical address range is the logical address area corresponding to the at least one bit.

11. The memory control circuit unit according to claim 10, wherein the memory management circuit is further configured to delete a mapping entry corresponding to the to-be-erased logical address range if data belonging to the to-be-erased logical address range is stored in a temporary physical erasing unit corresponding to the first logical unit after creating the erase index table corresponding to the first logical unit and marking the at least one bit among the bits in the erase index table as the first value.

12. The memory control circuit unit according to claim 11, wherein the memory management circuit is further configured to determine whether the data belonging to the to-be-erased logical address range is stored in the temporary physical erasing unit corresponding to the first logical unit after creating the erase index table corresponding to the first logical unit and marking the at least one bit among the bits in the erase index table as the first value.

13. The memory control circuit unit according to claim 11, wherein the memory management circuit is further configured to update a temporary mapping table of the temporary physical erasing unit corresponding to the first logical unit after deleting the mapping entry corresponding to the to-be-erased logical address range.

14. The memory control circuit unit according to claim 10, wherein in the operation of determining whether the first logical unit is mapped to any physical erasing unit among the physical erasing units, the memory management circuit determines whether any physical erasing unit among the physical erasing units is assigned as the mother physical erasing unit corresponding to the first logical unit, determines whether any physical erasing unit among the physical erasing units is assigned as the child physical erasing unit corresponding to the first logical unit and determines whether any physical erasing unit among the physical erasing units is assigned as the temporary physical erasing unit corresponding to the first logical unit, and
   the memory management circuit identifies the first logical unit as not mapped to any physical erasing unit among the physical erasing units if no physical erasing unit among the physical erasing units is assigned as the mother physical erasing unit, the child physical erasing unit and the temporary physical erasing unit corresponding to the first logical unit.

15. The memory control circuit unit according to claim 10, wherein in the operation of creating the erase index table corresponding to the first logical unit, the memory management circuit dynamically sets the size of each of the logical addresses areas according to the size of the logical unit, calculates the number of the logical addresses according to the size of each of the logical address areas and configures the bits of the erase index table according to the number of the logical address areas.

16. The memory control circuit unit according to claim 10, wherein
   the memory management circuit is further configured to determine whether a starting logical address of the to-be-erased logical address range follows an ending logical address indicated by a previous erase command if a second physical erasing unit among the physical erasing units is programmed as the child physical erasing unit corresponding to the first logical unit,
   the memory management circuit is further configured to determine whether an ending logical address of the to-be-erased logical address range is identical to an ending logical address of the first logical unit if the starting logical address of the to-be-erased logical address range follows the ending logical address indicated by the previous erase command, and
   the memory management circuit is further configured to delete a mapping entry of the first logical unit in the logical address-physical address mapping table if the ending logical address of the to-be-erased logical address range is identical to the ending logical address of the first logical unit.

17. The memory control circuit unit according to claim 16, wherein
   the memory management circuit is further configured to configured to give a command sequence to program default data into at least one physical programming unit of the second physical erasing unit if the starting logical address of the to-be-erased logical address range does not follow the ending logical address indicated by the previous erase command, wherein the at least one physical programming unit of the second physical erasing unit is mapped to the to-be-erased logical address range.

18. The memory control circuit unit according to claim 16, wherein
the memory management circuit is further configured to give a command sequence to program default data into at least one physical programming unit of the second physical erasing unit if the ending logical address of the to-be-erased logical address range is not identical to the ending logical address of the first logical unit, wherein the at least one physical programming unit of the second physical erasing unit is mapped to the to-be-erased logical address range.

19. A memory storage apparatus, comprising:
a connection interface unit, configured to couple to a host system;
a rewritable non-volatile memory module having a plurality of physical erasing units, each physical erasing unit among the physical erasing units having a plurality of physical programming units; and
a memory control circuit unit, coupled to the connection interface unit and the rewritable non-volatile memory module,
wherein the memory control circuit unit is configured to receive an erase command and identify a to-be-erased logical address range according to the erase command, wherein the to-be-erased logical address range belongs to a first logical unit;
wherein the memory control circuit unit is further configured to determine whether the first logical unit is mapped to any physical erasing unit among the physical erasing units according to a logical address-physical address mapping table,
the memory control circuit unit is further configured to transmit a message indicating that the erase command is finished in response to the erase command without actually performing an erasing operation on the rewritable non-volatile memory module if the first logical unit is not mapped to any physical erasing unit among the physical erasing units, and
the memory control circuit unit is further configured to create an erase index table corresponding to the first logical unit and mark at least one bit among a plurality of bits in the erase index table as a first value if a first physical erasing unit among the physical erasing units is assigned as a mother physical erasing unit corresponding to the first logical unit and no physical erasing unit among the physical erasing units is assigned as a child physical erasing unit corresponding to the first logical unit, wherein the first logical unit is divided into a plurality of logical address areas, each bit among the bits corresponds to one of the logical address areas, and the to-be-erased logical address range is the logical address area corresponding to the at least one bit.

20. The memory storage apparatus according to claim 19, wherein the memory control circuit unit is further configured to delete a mapping entry corresponding to the to-be-erased logical address range if data belonging to the to-be-erased logical address range is stored in a temporary physical erasing unit corresponding to the first logical unit after creating the erase index table corresponding to the first logical unit and marking the at least one bit among the bits in the erase index table as the first value.

21. The memory storage apparatus according to claim 20, wherein the memory control circuit unit is further configured to determine whether the data belonging to the to-be-erased logical address range is stored in the temporary physical erasing unit corresponding to the first logical unit after creating the erase index table corresponding to the first logical unit and marking the at least one bit among the bits in the erase index table as the first value.

22. The memory storage apparatus according to claim 20, wherein the memory control circuit unit is further configured to update a temporary mapping table of the temporary physical erasing unit corresponding to the first logical unit after deleting the mapping entry corresponding to the to-be-erased logical address range.

23. The memory storage apparatus according to claim 19, wherein in the operation of determining whether the first logical unit is mapped to any physical erasing unit among the physical erasing units, the memory control circuit unit determines whether any physical erasing unit among the physical erasing units is assigned as the mother physical erasing unit corresponding to the first logical unit, determines whether any physical erasing unit among the physical erasing units is assigned as the child physical erasing unit corresponding to the first logical unit and determines whether any physical erasing unit among the physical erasing units is assigned as the temporary physical erasing unit corresponding to the first logical unit, and
the memory control circuit unit identifies the first logical unit as not mapped to any physical erasing unit among the physical erasing units if no physical erasing unit among the physical erasing units is assigned as the mother physical erasing unit, the child physical erasing unit and the temporary physical erasing unit corresponding to the first logical unit.

24. The memory storage apparatus according to claim 19, wherein in the operation of creating the erase index table corresponding to the first logical unit, the memory control circuit unit dynamically sets the size of each of the logical addresses areas according to the size of the logical unit, calculates the number of the logical addresses according to the size of each of the logical address areas and configures the bits of the erase index table according to the number of the logical address areas.

25. The memory storage apparatus according to claim 19, wherein
the memory control circuit unit is further configured to determine whether a starting logical address of the to-be-erased logical address range follows an ending logical address indicated by a previous erase command if a second physical erasing unit among the physical erasing units is programmed as the child physical erasing unit corresponding to the first logical unit,
the memory control circuit unit is further configured to determine whether an ending logical address of the to-be-erased logical address range is identical to an ending logical address of the first logical unit if the starting logical address of the to-be-erased logical address range follows the ending logical address indicated by the previous erase command, and
the memory control circuit unit is further configured to delete a mapping entry of the first logical unit in the logical address-physical address mapping table if the ending logical address of the to-be-erased logical address range is identical to the ending logical address of the first logical unit.

26. The memory storage apparatus according to claim 25, wherein
the memory control circuit unit is further configured to program default data into at least one physical programming unit of the second physical erasing unit if the starting logical address of the to-be-erased logical address range does not follow the ending logical address indicated by the previous erase command, wherein the at least one physical programming unit of the second physical erasing unit is mapped to the to-be-erased logical address range.

27. The memory storage apparatus according to claim 25, wherein the memory control circuit unit is further configured to program default data into at least one physical programming unit of the second physical erasing unit if the ending logical address of the to-be-erased logical address range is not identical to the ending logical address of the first logical unit, wherein the at least one physical programming unit of the second physical erasing unit is mapped to the to-be-erased logical address range.

* * * * *